United States Patent
Yang

(10) Patent No.: US 7,834,437 B2
(45) Date of Patent: Nov. 16, 2010

(54) SEMICONDUCTOR PACKAGE WITH PASSIVE ELEMENTS

(75) Inventor: Seung Taek Yang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 101 days.

(21) Appl. No.: 11/777,346

(22) Filed: Jul. 13, 2007

(65) Prior Publication Data

US 2008/0308918 A1 Dec. 18, 2008

(30) Foreign Application Priority Data

Jun. 18, 2007 (KR) .................. 10-2007-0059312

(51) Int. Cl.
*H01L 23/48* (2006.01)
(52) U.S. Cl. .......... 257/678; 257/686; 257/685; 257/738; 257/626; 257/777; 257/E23.01
(58) Field of Classification Search .......... 257/678, 257/686, 685, 738, 626, 777, E23.01
See application file for complete search history.

(56) References Cited

U.S. PATENT DOCUMENTS 7,087,514 B2 * 8/2006 Shizuno .......... 438/617
7,184,276 B2 * 2/2007 Hashimoto .......... 361/803
2004/0178495 A1 * 9/2004 Yean et al. .......... 257/723
2006/0283625 A1 * 12/2006 Yamamichi et al. .......... 174/255
2008/0284045 A1 * 11/2008 Gerber et al. .......... 257/778

FOREIGN PATENT DOCUMENTS

KR  2004-0071177 A  8/2004
KR  2006-0007920 A  1/2006
KR  2006-0064518 A  6/2006

* cited by examiner

*Primary Examiner*—Lynne A Gurley
*Assistant Examiner*—Junghwa M Im
(74) *Attorney, Agent, or Firm*—Ladas & Parry LLP

(57) ABSTRACT

The semiconductor package includes a plate having first via patterns formed on a center portion and second via patterns formed on edge portions; a connection wiring formed on a top surface of the plate to connect at least one first via patterns to at least one second via patterns; a plurality of passive elements formed on the top surface of the plate having a connection wiring formed thereon; a semiconductor chip having a plurality of bonding pads attached to a bottom surface of the plate and electrically connected to the first via patterns; and a plurality of external connection terminals each of which being attached to each of the second via pattern on the bottom surface of the plate.

14 Claims, 5 Drawing Sheets

SEMICONDUCTOR PACKAGE WITH PASSIVE ELEMENTS

CROSS-REFERENCE TO RELATED APPLICATIONS

The present application claims priority to Korean patent application number 10-2007-0059312 filed on Jun. 18, 2007, which is incorporated herein by reference in its entirety.

BACKGROUND OF THE INVENTION

The present invention relates to a semiconductor package, and more particularly to a semiconductor package capable of preventing deterioration caused due to heat of a semiconductor chip, as well as preventing reliability degradation therefrom.

With respect to light, slim, short, and small electronics such as a notebook computer, a mobile phone, or a PDA, miniaturization of the semiconductor package mounted on a related component is required, i.e., a printed circuit board (hereinafter, "PCB").

The semiconductor package is generally structured in such a way that at least one semiconductor chip is loaded. It is necessary to mount such semiconductor packages, and various passive elements needed to transfer signal without characteristic degradation, in order to implement specific electronic circuits set using the semiconductor package. The passive elements are exemplified as a resistor R, an inductor L, and a capacitor C, which can be mounted on PCB with the semiconductor package mounted thereon.

Since the passive elements that are necessary to prevent deterioration of the signal characteristics are mounted on the PCB, there is a problem that the total area of the PCB is unnecessarily enlarged, which hinders the miniaturization of the product. Moreover, since the passive elements are directly mounted on the PCB, there is a problem that lengthening of the signal line can cause a delay in signal transfer. Additionally, there is a problem that noise can be inserted while transferring the signal, whereby prevention of the deterioration of the signal characteristic is limited. Generally, the passive elements occupy the circuit at a weight of about 80 percent, and the passive elements occupy about 50 percent of the total size of the printed circuit board.

Therefore, the passive elements have a significant effect on cost, size and reliability of the electronic machines. There has been researches conducted on a technology for an embedded-type passive element in which the passive elements are embedded in a multi-layered printed circuit board. This approach will allow various components to be integrated as one module to improve mounting density, and does not involve a method for miniaturizing each of components separately.

The technology for implementing the embedded passive element includes a System on Chip (SoC) in which the passive elements are integrally formed in the semiconductor chip and a System in Package in which functional elements are embedded in a package form.

The formation of the passive elements composed of multi-layered metal wiring into wafer level is complicated during the process of forming the multi-layered metal wiring because of warping of the thin thickness of the wafer and the deterioration of the semiconductor chip.

Additionally, during the formation of the passive elements on the multi-layered printed circuit board, a reliability of the semiconductor package is likely to be degraded due to a difference of coefficient thermal expansions (CTE) of the substrate and the multi-layered wiring.

SUMMARY OF THE INVENTION

Embodiments of the present invention are directed to a semiconductor package, which can prevent deterioration caused from heat of a semiconductor chip, and prevent reliability degradation.

According to one embodiment of the present invention, a semiconductor package may comprise: a plate having first via patterns formed on a center portion and second via patterns formed on edge portions; a connection wiring formed on a top of the plate surface to connect at least one first via pattern to at least one second via pattern; a plurality of passive elements formed on the top surface of the plate having the connection wiring formed thereon; a semiconductor chip having a plurality of bonding pads attached to a bottom surface of the plate and electrically connected to the first via patterns; and a plurality of external connection terminals each of which is attached to each of the second via pattern on the bottom surface of the plate.

The plate comprises a wafer.

The first via patterns and second via patterns are formed with any one of Tin (Sn), Nickel (Ni), Aluminum (Al), Copper (Cu) and Gold (Au) or alloy respectively thereof.

The passive elements comprise a plurality of first metal patterns, an insulating film covering the first metal patterns and second metal patterns formed on the insulating film in a position corresponding to the first metal patterns.

A capping film is formed on the insulating film and the second metal patterns to cover the second metal patterns.

The first via patterns of the plate and the bonding pads of the semiconductor chip are electrically connected to each other at bumps.

An embedded material is formed between the plate and the semiconductor chip.

The external connection terminals comprise solder balls.

The external connection terminals are formed with a height greater than that from the bottom surface of the plate to the bottom surface of the semiconductor chip.

According to another embodiment of the present invention, a semiconductor package with at least two stacked package units comprises: a plate of which multiple first via patterns are formed on a center portion and second via patterns are formed on edge portions o; a connection wiring formed on a top surface to connect the first via patterns with the second via patterns; a plurality of passive elements formed on the top surface of the plate including the connection wiring; third via patterns formed within the passive element and connecting to the second via pattern within the passive element; a semiconductor chip with a plurality of bonding pads attached on a bottom surface of the plate and electrically connected to the first via patterns; and a plurality of external connection terminals attached to each of the second via patterns on a bottom surface of the wafer.

The plate comprises a wafer.

The first, second, and third via patterns are formed with any one of Sn, Ni, Al, Cu and Au or alloy respectively thereof.

The passive elements comprise a plurality of first metal patterns, an insulating film covering the first metal patterns and second metal patterns formed on the insulating film in a position corresponding to the first metal patterns.

A capping film is formed on the insulating film to cover the second metal patterns.

The first via patterns of the plate and the bonding pads of the semiconductor chip are electrically connected to each other at bumps.

An embedded material is formed between the plate and the semiconductor chip.

The external connection terminals comprise solder balls.

The external connection terminals are formed with a height greater than that from the bottom surface of the plate to the bottom surface of the semiconductor chip.

DESCRIPTION OF SPECIFIC EMBODIMENTS

According to a preferred embodiment of the present invention, multiple via patterns are formed within a plate which is composed of wafers having a thickness greater than that of a wafer with elements formed thereon, passive elements are formed on a top surface of the plate, and a semiconductor chip is attached on a bottom surface of the plate, thereby manufacturing a single-type or stack-type semiconductor package.

Therefore, it is possible to solve warping-type problems of the thinner wafers that occur during the formation process of the passive elements by forming the passive elements on a wafer thicker than that in the prior art. It is also possible to reduce the likelihood of damaging the semiconductor chip due to heat generated during the process of forming the passive elements by forming the passive elements of multi-layered structure composed of a multi-layered metal wiring and a capping film on a separate wafer, to thereby improve a reliability of the semiconductor package.

More specifically, a semiconductor package according to an embodiment of the present invention will be described with reference to FIG. 1.

Figure 1:
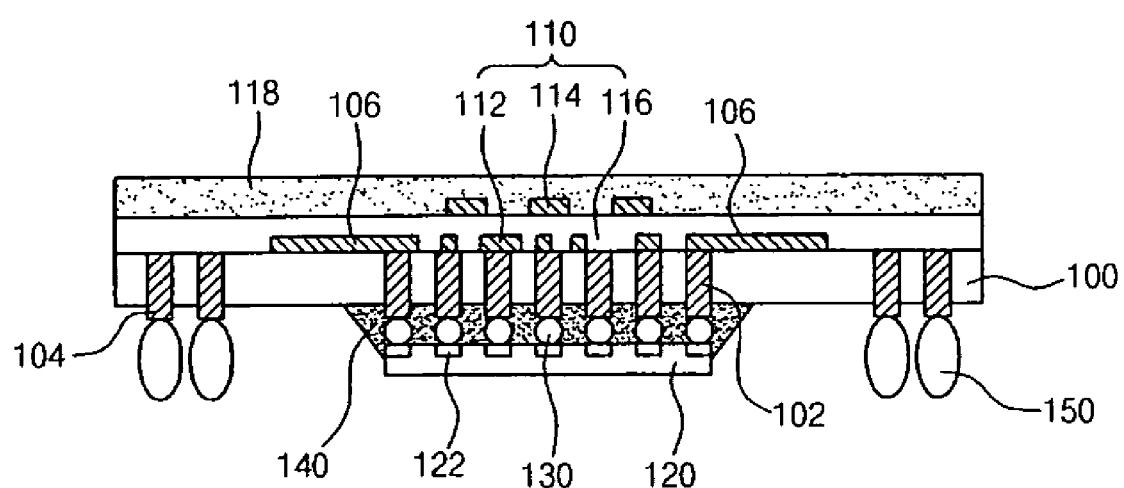
FIG. 1 is a cross-sectional view illustrating a semiconductor package in accordance with one embodiment of the present invention.

As shown in FIG. 1, first via patterns 102 are formed in a center portion of plate 100 and multiple second via patterns 104 are formed on edge portions of a plate 100, and a connection wiring 106 is formed on a top surface of the plate 100 to connect the first via pattern 102 to the second via pattern 104. The plate 100 can be composed of various kinds of wafers, including a silicon wafer. The first and second via patterns 102, 104 are made of any one of Sn, Ni, Al, Cu and Au or alloy respectively thereof.

A passive element 110 electrically connected to the first and second via pattern 102, 104 is formed on a top portion of the plate 100. The passive element 110 includes first metal patterns 112 and an insulating film 116 covering the first metal patterns 112 which are formed on the top portion of the plate 100, and second metal patterns 114 which are formed on the insulating film 116 in a position corresponding to the first metal patterns 112. A capping film 118 is formed on a top surface of the insulating film 116 and including the second metal patterns 114 to cover the second metal patterns 114, and thereby insulate and protect the second metal patterns 114.

A semiconductor chip 120 having a plurality of bonding pads 122 electrically and physically connected to the first via pattern 102 at a lower portion of the plate 100. The first via patterns 102 is connected to the bonding pads 122 of the semiconductor 120 at bumps 130, so that the bonding pads 122 are rewired. An embedded material 140 is formed between the plate 100 and the semiconductor chip 120 to protect a joint part.

External connection terminals 150, electrically and physically connect to the second via patterns 104 are connected to a lower portion of the plate 100. The external connection terminals 150 are preferably solder balls. The external connection terminals 150 are attached for mounting the plate 100, including the passive element 110 and the semiconductor chip 120, on the external circuit. Therefore, the external connection terminals 150 are configured to have a height greater than that from a bottom surface of the plate 100 to a bottom surface of the semiconductor chip 120.

According to an embodiment of the present invention, such a semiconductor package can solve the warping associated problems of the thin wafer which have been caused when elements are formed thereon, such as during the process of forming the passive element, because the passive element is formed on the top surface of the plate and the semiconductor chip is attached on the bottom surface of the plate. Furthermore, by forming the passive element composed of multi-layered metal wiring on the wafer instead of the substrate, it is possible to solve the deterioration of the semiconductor chip that is caused by heat generated during the process of forming the passive element.

Hereinafter, FIGS. 2A through 2F will be discussed which refer to a method for manufacturing the semiconductor package.

Figure 2A:
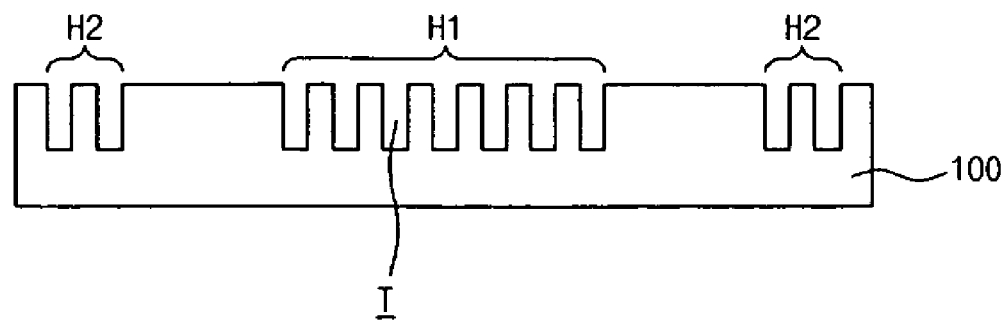
FIGS. 2A through 2F are cross-sectional views illustrating the process steps of a method for manufacturing the semiconductor package in accordance with an embodiment of the present invention.

Referring to FIG. 2A, a plate 100 composed of various kinds of wafers including a silicon wafer is prepared, and then a plurality of grooves T is formed on the first and second via pattern regions H1, H2 of the plate 100 with a depth to allow the plate 100 not to be penetrated. The first pattern regions H1 is disposed in a center portion of the plate and the second pattern regions H2 is disposed at the edge portions of the plate 100

Figure 2B:
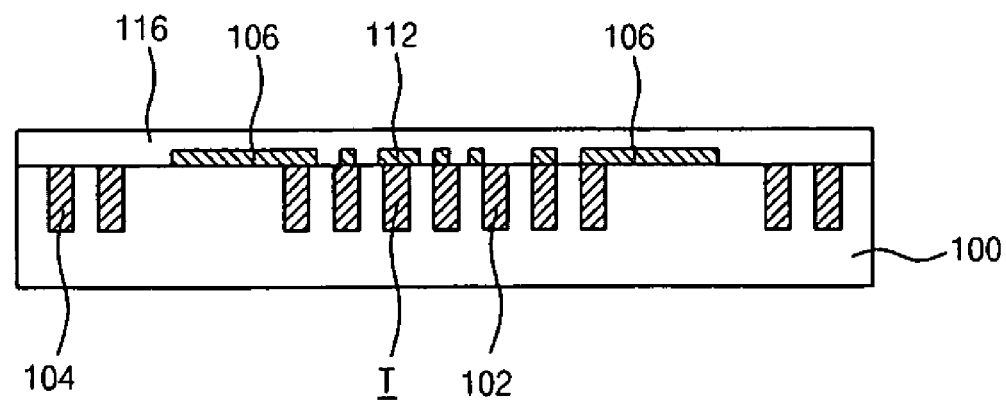

Referring to FIG. 2B, the first and second via patterns 102, 104 are formed by embedding the interior of the grooves T with any one of Sn, Ni, Al, Cu and Au or alloy respectively thereof. The metal materials are formed viaa sputtering process, an electrolysis process or an electroless process.

Connection wirings 106 are then formed to individually connect the first via pattern 102 and the second via pattern 104 on the top surface of the plate 100, and a first metal pattern 112 for forming the passive element, by etching the metal layer. Then, an insulating film 116 composed of organic materials is formed to cover the first metal pattern 112.

Figure 2C:
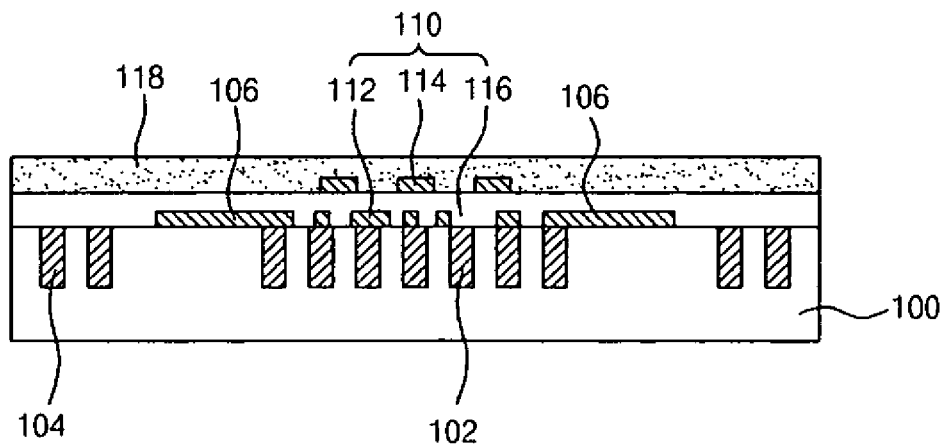

Referring to FIG. 2C, after forming the metal layer on the insulating film 116, we form the second metal pattern 114 on a portion of the insulating film 116 in a position corresponding to the first metal pattern 112 by patterning the metal layer, thereby forming the passive element 110 including the first and second metal patterns 112, 114 and the insulating film 116. The metal layer for use in the connection wiring 106 and the first and second metal pattern 112, 114 are formed with any one of Sn, Ni, Al, Cu and Au or alloy respectively thereof. A capping film 118 is formed on the insulating film 116 including the second metal pattern 114, in order to protect the second metal pattern 114 from the outside.

Figure 2D:
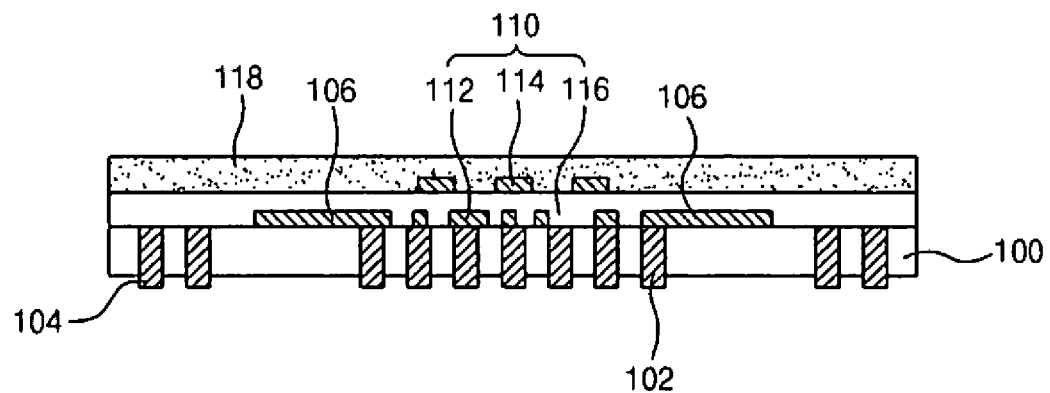

Referring to FIG. 2D, a bottom surface of the plate 100 is eliminated to expose the first via pattern 102 and the second via pattern 104 formed within the plate 100 using at least any one of a grinding process and an etching process. At this time, the elimination of the bottom surface of the plate 100 is carried out in such a way that bottom surfaces of the first and second via patterns 102, 104 project a prescribed length from the bottom surface of the plate 100.

Figure 2E:
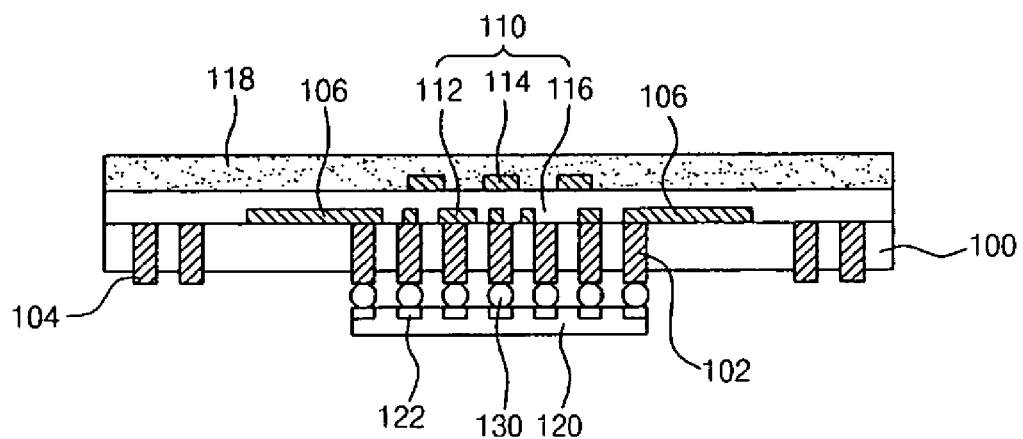

Referring to FIG. 2E, the semiconductor chip 120 with bonding pads 122 rewired to correspond to the exposed first via pattern 102 is attached on the bottom surface of the plate 100. At this time, the semiconductor chip 120 is attached to the first via pattern 102 at the bumps 130 formed in the bonding pad 122.

Figure 2F:
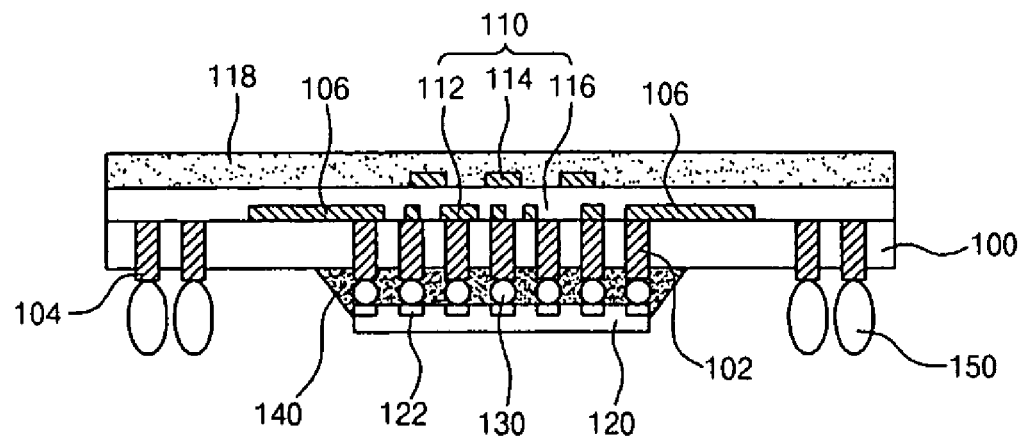

Referring to FIG. 2F, an embedded material 140 is filled for protecting a joint portion formed through the bumps 130 between the plate 100 and the semiconductor 120. According to an embodiment of the present invention, an external connection terminal 150, preferably, a solder ball is attached to the second via pattern 104 of the plate 100. The external connection terminal 150 mounts to an external circuit and is configured to have a height greater than that from the bottom surface of the plate 100 to the bottom surface of the semiconductor chip 120.

The method for manufacturing the semiconductor package according to an embodiment of the present invention can be proceeded using the plate of wafer level, and resultantly can permit the plate to be sawed into chip level, thereby obtaining a plurality of semiconductor packages.

In addition, though the embodiment of the present invention mentioned above implements the single-type semiconductor package, the stack-type semiconductor package can be also implemented in which at least two package units of above-mentioned structure are stacked.

Figure 3:
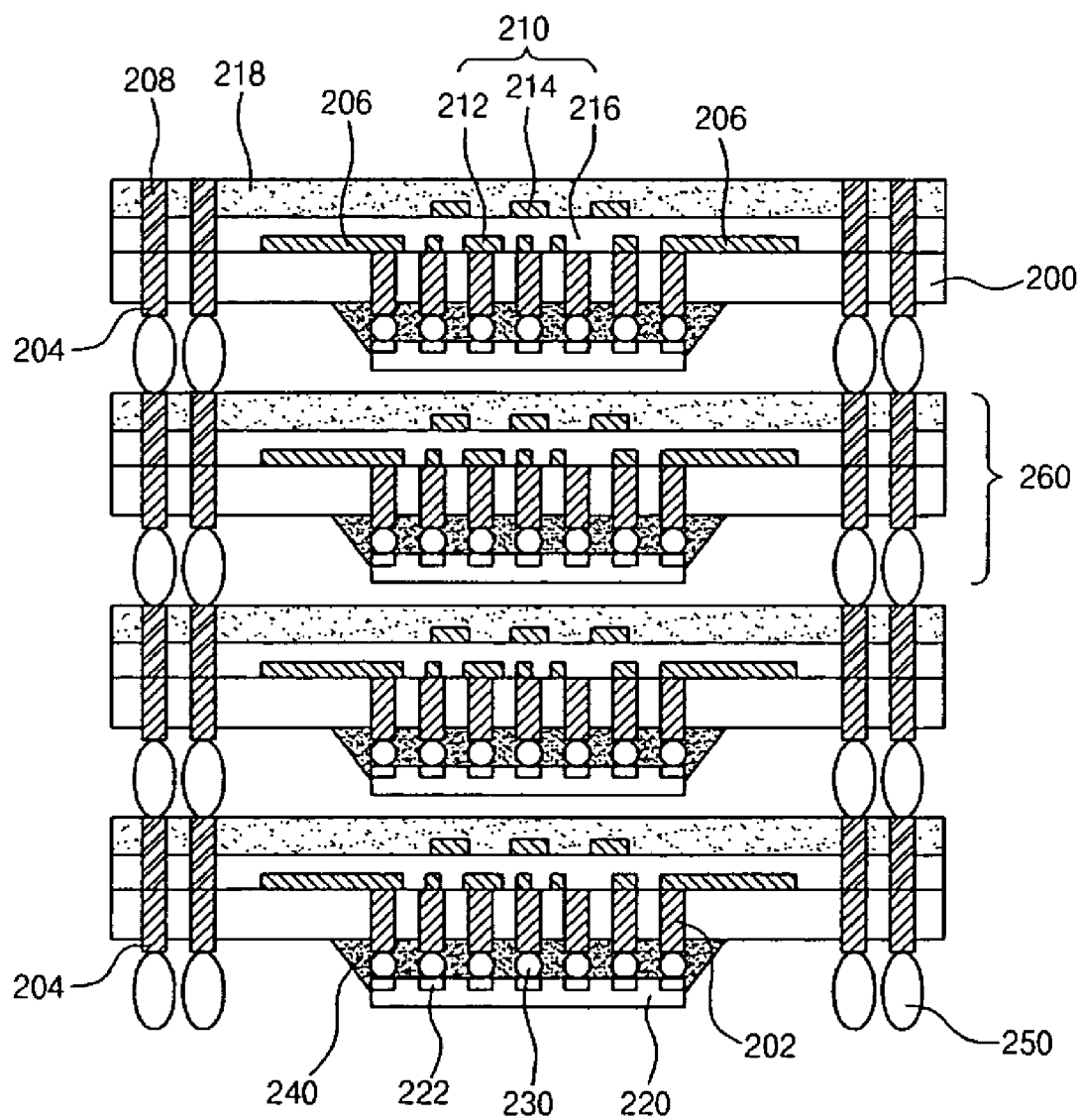
FIG. 3 is a cross-sectional view illustrating a stack-type semiconductor package in accordance with another embodiment of the present invention.

FIG. 3 is a cross-sectional view illustrating a stack-type semiconductor package in accordance with another embodiment of the present invention.

As shown in FIG. 3, according to another embodiment of the present invention, a semiconductor package is formed by stacking at least two package units 260.

As shown in FIG. 3, the package units 260 are composed of a passive element 210 having the structure as shown in FIG. 2F, that is, an insulating film 216 in a position corresponding to a second via pattern 204 and a third via pattern 208 penetrating a capping film 218.

More specifically, a passive pattern 210 composed of a connection wiring 206 connecting the first and second via patterns 202, 204, the first and second metal patterns 212, 214 and an insulating 216 is formed on a top surface of the plate 200 with the first and second via patterns 202, 204 formed therein, and third patterns 208 are formed in a position corresponding to the second via patterns 204 and penetrate the insulating film 216 and the capping film 218. The semiconductor chip 220 with a plurality of bonding pads 222 is attached on a lower portion of the first via patterns 202 through bumps 230 and external connection terminals 250 are attached to a lower portion of the second via patterns 204.

The external connection terminals 250 of upper stacked package unit 260 are attached on the third via patterns 208 of a lower stacked package unit 260 to connect the stacked package units 260 electrically and physically. The third via patterns 208 are formed with any one of Sn, Ni, Al, Cu and Au or alloy respectively thereof.

The first and second via patterns 202, 204, the first and the second metal patterns 212, 214, the connection wiring 206, the insulating film 216, the passive element 210, the capping film 218, the semiconductor chip 220, the embedded material 240 and the external connection terminals 250 which compose the stacked package unit are similar to the structure mentioned in FIG. 1, and the method for manufacturing the package unit is also similar to that described in FIG. 2a-2f.

Meanwhile, according to an embodiment of the present invention, the stacked semiconductor package can be formed by stacking the wafer-level package unit produced at the wafer level and thereafter sawing it, or by sawing the package unit and thereafter stacking the cut package units.

As described above, the present invention can solve the problems in the process of forming the passive element caused due to warping of prior thin wafer, since a plurality of via patterns is formed within the plate composed of wafers having a thickness greater than that of the wafer with the elements formed thereon, the passive elements are formed on a top surface of the plate, and the semiconductor chip is attached on a bottom surface of the plate, thereby manufacturing a single-type or stack-type semiconductor package.

Moreover, since multi-layered passive element composed of the multi-layered metal wiring and the capping film can be formed on a separate wafer, it is possible to prevent the semiconductor chip from being damaged due to heat during process of forming the passive element.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a plate having first via patterns formed on a center portion and second via patterns formed on edge portions;
   a connection wiring formed on a top surface of the plate to connect directly at least one first via pattern to at least one second via pattern;
   a plurality of passive elements formed on the top surface of the plate having the connection wiring formed thereon;
   a semiconductor chip having a plurality of bonding pads, the semiconductor chip being attached to a bottom surface of the plate opposite the top surface of the plate and electrically connected to the first via patterns; and
   a plurality of external connection terminals, each of which is attached to each of the second via pattern on the bottom surface of the plate,
   wherein the passive element comprises a plurality of first metal patterns formed with the connection wiring, an insulating film covering all of the first metal patterns and the connection wiring, and a plurality of second metal patterns formed on the top surface of the insulating film and spaced apart from the first metal patterns in a position corresponding to the first metal patterns, and
   wherein the plate is composed of a wafer having a thickness greater than that of the semiconductor chip.

2. The semiconductor package according to claim 1, wherein the first and second via patterns made from any one of Sn, Ni, Al, Cu and Au or alloy respectively thereof.

3. The semiconductor package according to claim 1, further comprising a capping film formed on the top surface of the insulating film and the second metal pattern so as to cover the second metal patterns.

4. The semiconductor package according to claim 1, wherein the first via pattern of the plate and a bonding pad of the semiconductor chip are electrically connected to each other at bumps.

5. The semiconductor package according to claim 1, further comprising an embedded material formed between the plate and the semiconductor chip.

6. The semiconductor package according to claim 1, wherein the external connection terminals comprise solder balls.

7. The semiconductor package according to claim 6, wherein the external connection terminals are a height greater than that from the bottom surface of the plate to the bottom surface of the semiconductor chip.

8. A semiconductor package with at least two stacked package units, wherein the package units comprises:
- a plate having first via patterns formed on a center portion and second via patterns formed on edge portions;
- a connection wiring formed on a top surface of the plate to connect directly at least one first via pattern to at least one second via pattern;
- a plurality of passive elements formed on the top surface of the plate having the connection wiring formed thereon;
- at least one third via pattern formed within the passive element and connecting to each of the second via pattern;
- a semiconductor chip having a plurality of bonding pads, the semiconductor chip being attached to a bottom surface of the plate opposite the top surface of the plate and electrically connected to the first via patterns; and
- a plurality of external connection terminals each of which being attached to each of the second via pattern on a bottom surface of the plate,
- wherein the passive element comprises a plurality of first metal patterns formed with the connection wiring, an insulating film covering all of the first metal patterns and the connection wiring, and a plurality of second metal patterns formed on the top surface of the insulating film and spaced apart from the first metal patterns in a position corresponding to the first metal patterns, and
- wherein the plate is composed of wafers having a thickness greater than that of a semiconductor chip.

9. The semiconductor package according to claim 8, wherein the first, second and third via patterns are made from any one of Sn, Ni, Al, Cu and Au or alloy respectively thereof.

10. The semiconductor package according to claim 8, further comprising a capping film formed on the top surface of the insulating film and the second metal patterns so as to cover the second metal patterns.

11. The semiconductor package according to claim 8, wherein the first via pattern of the plate and a bonding pad of the semiconductor chip are electrically connected to each other at bumps.

12. The semiconductor package according to claim 8, further comprising an embedded material formed between the plate and the semiconductor chip.

13. The semiconductor package according to claim 8, wherein external connection terminals comprise solder balls.

14. The semiconductor package according to claim 13, wherein the external connection terminals are a height greater than that from the bottom surface of the plate to the bottom surface of the semiconductor chip.

* * * * *